(12) United States Patent
Basker et al.

(10) Patent No.: US 8,420,464 B2
(45) Date of Patent: Apr. 16, 2013

(54) SPACER AS HARD MASK SCHEME FOR IN-SITU DOPING IN CMOS FINFETS

(75) Inventors: Veeraraghavan S. Basker, Schenectady, NY (US); Kangguo Cheng, Schenectady, NY (US); Bruce B. Doris, Brewster, NY (US); Johnathan E. Faltermeier, Delanson, NY (US); Sivananda K. Kanakasabapathy, Niskayuna, NY (US); Hemant Adhikari, Chicago, IL (US)

(73) Assignees: International Business Machines Corporation, Armonk, NY (US); Globalfoundries Inc., Grand Cayman (KY)

( * ) Notice: Subject to any disclaimer, the term of this patent is extended or adjusted under 35 U.S.C. 154(b) by 114 days.

(21) Appl. No.: 13/100,589

(22) Filed: May 4, 2011

(65) Prior Publication Data

US 2012/0280250 A1    Nov. 8, 2012

(51) Int. Cl.
*H01L 21/8238* (2006.01)

(52) U.S. Cl.
USPC ........... 438/157; 438/199; 438/283; 438/300; 257/E21.431

(58) Field of Classification Search .................. 438/157, 438/199, 206, 275, 279, 283, 300; 257/328, 257/E21.43, E21.431, E29.13, E29.201
See application file for complete search history.

(56) References Cited

U.S. PATENT DOCUMENTS

| | | | |
|---|---|---|---|
| 3,852,086 A | 12/1974 | Murata et al. | |
| 4,798,764 A | 1/1989 | Tressler et al. | |
| 5,550,082 A | 8/1996 | Wolfe et al. | |
| 7,871,876 B2 * | 1/2011 | Anderson et al. | 438/198 |
| 7,915,693 B2 * | 3/2011 | Okano | 257/401 |
| 8,263,462 B2 * | 9/2012 | Hung et al. | 438/286 |
| 8,278,179 B2 * | 10/2012 | Lin et al. | 438/305 |
| 2010/0203732 A1 | 8/2010 | Doris et al. | |
| 2011/0042744 A1 | 2/2011 | Cheng et al. | |
| 2012/0018730 A1 * | 1/2012 | Kanakasabapathy et al. | 257/66 |

OTHER PUBLICATIONS

U.S. Appl. No. 12/688,347, filed Jan. 15, 2010.
U.S. Appl. No. 12/819,440, filed Jun. 21, 2010.

* cited by examiner

*Primary Examiner* — Tuan N. Quach
(74) *Attorney, Agent, or Firm* — Scully, Scott, Murphy & Presser, P.C.; Yuanmain Cal

(57) ABSTRACT

A method of fabricating a semiconductor device that includes at least two fin structures, wherein one of the at least two fin structures include epitaxially formed in-situ doped second source and drain regions having a facetted exterior sidewall that are present on the sidewalls of the fin structure. In another embodiment, the disclosure also provides a method of fabricating a finFET that includes forming a recess in a sidewall of a fin structure, and epitaxially forming an extension dopant region in the recess that is formed in the fin structure. Structures formed by the aforementioned methods are also described.

7 Claims, 6 Drawing Sheets

US 8,420,464 B2

SPACER AS HARD MASK SCHEME FOR IN-SITU DOPING IN CMOS FINFETS

BACKGROUND

The present disclosure relates generally to semiconductor devices. More particularly, the present disclosure relates to finFET semiconductor devices.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties. Additionally, all dimensions of the device must be scaled simultaneously in order to optimize the electrical performance of the device. With conventional planar FET scaling reaching fundamental limits, the semiconductor industry is looking at more unconventional geometries that will facilitate continued device performance improvements, such as finFET semiconductor devices.

SUMMARY

A method of fabricating a semiconductor device is provided that includes at least two fin structures, wherein one of the at least two fin structures includes epitaxially formed in-situ doped source and drain regions having a facetted exterior sidewall that are present on the sidewalls of the fin structure. In one embodiment, the method includes providing a first fin structure for a first conductivity semiconductor device and a second fin structure for a second conductivity semiconductor device on a substrate, and forming a gate structure in direct contact with at least a channel portion of the first fin structure and the second fin structure. A blanket dielectric is formed over the first fin structure and the second fin structure, and a portion of the blanket dielectric is removed to expose at least sidewalls of the second fin structure, wherein a remaining portion of the blanket dielectric covers at least sidewalls of the first fin structure. In-situ doped second source and drain regions having a facetted exterior sidewall may be epitaxially formed on the sidewalls of the second fin structure, wherein the remaining portion of the blanket dielectric obstructs epitaxial growth on the sidewalls of the first fin structure. The remaining portion of the blanket dielectric is removed to expose at least the sidewalls of the first fin structure. First source and drain regions are formed on the sidewalls of the first fin structure.

In another aspect, a CMOS device including finFET devices is provided, in which the source and drain regions of one of the finFET devices includes an epitaxial portion having a facetted exterior sidewall. In one embodiment, the CMOS semiconductor device includes a first finFET on a first portion of a substrate, and a second finFET on a second portion of the substrate. The first finFET includes first source and drain regions of a first conductivity. The first source and drain regions include first extension portions in sidewalls of a first fin structure of the first finFET and first contact portions in direct contact with the first extension portions. The second finFET includes source and drain regions of a second conductivity. The source and drain regions of the second conductivity may include second extension portions in sidewalls of a second fin structure of the second finFET, epitaxial portions having a facetted exterior sidewall present on the sidewalls of the fin structure, and second contact portions in direct contact with the epitaxial portions.

In another aspect, a method of forming a finFET is provided that includes providing a fin structure, in which a dielectric cap is present on the upper surface of the fin structure. A gate structure is formed in direct contact with a channel portion of the fin structure. The fin structure may be laterally etched selective to the dielectric cap. The laterally etching of the fin structure forms a recess underlying the dielectric cap. An in-situ doped semiconductor material may be epitaxially grown on the recess underlying the dielectric cap. The in-situ doped semiconductor material provides an extension region of at least one of a source region and a drain region of the finFET.

In another aspect, a finFET semiconductor device is provided that includes a fin structure having a first width, and a dielectric cap present on an upper surface of the fin structure having a second width. The second width of the dielectric cap is greater than the first width of the fin structure. A gate structure is present on a channel sidewall portion of the fin structure. The gate structure is also present on a portion of the dielectric cap that is on the upper surface of the channel portion of the fin structure. A doped epitaxial semiconductor material is in direct contact with a sidewall of the fin structure that is adjacent to the channel sidewall portion of the fin structure. The doped epitaxial semiconductor material fills at least a portion of the undercut region underlying the dielectric cap. The doped epitaxial semiconductor material provides an extension region of at least one of a source region and a drain region.

DESCRIPTION OF THE SEVERAL VIEWS OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Figure 1:
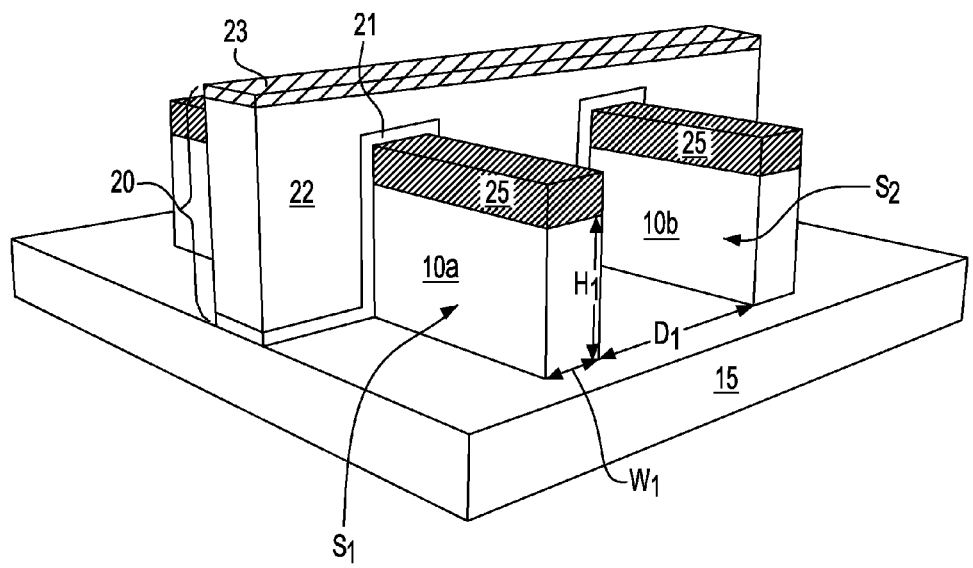
FIG. 1 is a perspective view depicting forming a first fin structure for a first conductivity semiconductor device and a second fin structure for a second conductivity semiconductor device on a substrate, and forming a gate structure in direct contact with at least a channel portion of the first fin structure and the second fin structure, in accordance with one embodiment of the present disclosure.

Detailed embodiments of the methods and structures of the present disclosure are described herein; however, it is to be understood that the disclosed embodiments are merely illustrative of the disclosed structures and methods that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The present disclosure is directed towards finFET semiconductor devices, and methods of forming finFET semiconductor devices. As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. As used herein a "field effect transistor" is a transistor in which output current, i.e., source-drain current, is controlled by the voltage applied to the gate. A field effect transistor has three terminals, i.e., gate, source and drain. A finFET semiconductor device is a field effect transistor, in which the body of the field effect transistor that contains the channel is present in a fin structure. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure.

It has been determined that as the height of the fin structures defines the channel, it can be advantageous to dope the fin structure uniformly along its entire height, which may be difficult because of 3D nature of the structure. It has further been recognized that ion implantation techniques when applied to the thin body of the fin structures of FinFET devices can damage the extension regions, as well as the source and drain regions, leading to higher external resistance.

In-situ doped epitaxial semiconductor material has proved to be a useful technique to dope 3D devices uniformly, such as p-type finFETs. However, implementing doped epitaxial semiconductor material preferentially for one set of devices presents another set of challenges. For example, in finFETs with a fin structure having a width of 15 nm or less, which are disposed on a silicon oxide dielectric substrate, selective implementation of epitaxial semiconductor growth to specific finFETs has proven to be a difficult, because the formation and removal of hardmasks, such as oxide containing hardmasks, that dictate which portions of the substrate may be processed, typically can not be implemented without undercutting the dielectric surface that the fin structure is present on. Damaging the dielectric that is under the fin structure typically results in the fin structures lifting off the substrate. Further undercutting of the dielectric may create divots for potential source-to-drain shorting.

In one embodiment, the present disclosure provides a method that allows for in-situ doping of epitaxially grown semiconductor material that can be selectively applied to finFETs, such as p-type and n-type finFETs. In this method, instead of performing a spacer etch for n-type finFET and the p-type finFET at the same time, the spacer etch is applied for only one of the finFETs, e.g., the p-type finFET, while a portion of the material the provides the spacer of the one finFET covers the entirety of the other finFET, e.g., n-type finFET, during an epitaxial growth process that forms an in-situ doped epitaxial semiconductor material having a facetted exterior sidewall on the exposed sidewall of the finFET, e.g., the p-type finFET, that is not underlying the remaining portion of the spacer material. For example, the sidewall surface region of a fin structure that provides the p-type finFET from which the spacer material has been stripped can grow in-situ boron doped epitaxial SiGe, while the remaining portion of the spacer material that is covering the fin structure that provides the n-type finFET will prevent epitaxial growth of the in-situ boron doped epitaxial SiGe on the n-type finFET. After the epitaxial growth is concluded on the exposed sidewall of the finFET, e.g., p-type finFET, the remaining portion of the spacer material that is overlying the fin structure of the other finFET, e.g., n-type finFET, is removed. An extension implant is then applied to the fin structure of the finFET that does not include the in-situ doped epitaxial semiconductor material having the facetted exterior sidewall. An undoped epitaxial semiconductor material is then grown on both of the finFETs, which is subsequently implanted to provide source and drain contact regions. The details of the above-described method are now discussed with greater detail referring to FIGS. 1-8.

FIG. 1 depicts an initial structure used in one embodiment of a method for forming a CMOS semiconductor device including at least two finFETs. FIG. 1 depicts forming a first fin structure 10a for a first conductivity semiconductor device, e.g., n-type finFET, and a second fin structure 10b for a second conductivity semiconductor device, e.g., p-type finFET, on a substrate 15, and forming a gate structure 20 in direct contact with at least a channel portion of the first fin structure 10a and the second fin structure 10b. In one embodiment, a dielectric fin cap 25 may be present on the fin structure 200. The substrate 15 may be composed of a dielectric material, and is hereafter referred to as a dielectric substrate 15.

In one embodiment, the fin structures 10a, 10b and the dielectric substrate 15 may be provided from an SOI substrate, in which the top semiconductor layer of the SOI substrate provides the fin structures 10a, 10b. The SOI substrate typically includes a bottom semiconductor layer (not show) and a top semiconductor layer (hereafter referred to as an SOI layer), which is the material layer that provides the fin structure 10a, 10b, that are electrically isolated from each other by a buried insulating layer, which is the material layer that provides the dielectric substrate 15. The SOI layer and the bottom semiconductor layer may comprise at least one of Si, Ge alloys, SiGe, GaAs, InAs, InP, SiCGe, SiC as well as other III/V or II/VI compound semiconductors. The SOI layer and bottom semiconductor layer may comprise the same or different materials.

The dielectric layer separating the SOI layer and the bottom semiconductor layer may be a crystalline or non-crystalline oxide, nitride, oxynitride, or any other insulating material. The SOI substrate may be formed utilizing a layer transfer process including a bonding step. Alternatively, an implantation process such as SIMOX (Separation by IMplantation of OXygen) can be used in forming the SOI substrate.

The thickness of the various layers of the SOI substrate may vary depending on the technique used in forming the same. In one embodiment, the SOI layer has a thickness ranging from 3 nm to 100 nm, the dielectric layer (also referred to as buried dielectric layer) has a thickness ranging from 10 nm to 150 nm, and the thickness of the bottom semiconductor layer of the SOI substrate may range from 10 nm to 500 nm.

Although an SOI substrate is used to describe the formation of the fin structures 10a, 10b, a bulk semiconductor substrate can also be utilized. In one example, in which a bulk semiconductor substrate is used, the bulk semiconductor substrate comprises at least one of Si, Ge alloys, SiGe, GaAs, InAs, InP, SiCGe, SiC as well as other III/V or II/VI compound semiconductors. A dielectric layer is then formed atop the bulk substrate, and a semiconductor layer is formed atop the dielectric layer, wherein the semiconductor layer is patterned and etched to provide the fin structures 10a, 10b and the dielectric layer provides the dielectric substrate 15.

In one embodiment, prior to etching the SOI substrate to provide the fin structures 10a, 10b, a layer of the dielectric material that provides the dielectric fin cap 25 is deposited atop the SOI layer. The dielectric fin cap 25 may be composed of a nitride, oxide, oxynitride material, and/or any other suitable dielectric layer. In one example, the dielectric fin cap 25 is composed of silicon oxide formed by thermal oxidation. The dielectric fin cap 25 may comprise a single layer of dielectric material or multiple layers of dielectric materials. The dielectric fin cap 25 can be formed by a deposition process, such as chemical vapor deposition (CVD) and/or atomic layer deposition (ALD). Chemical vapor deposition (CVD) is a deposition process in which a deposited species is formed as a result of chemical reaction between gaseous reactants at greater than room temperature, wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. Alternatively, the dielectric fin cap 25 may be formed using a growth process, such as thermal oxidation or thermal nitridation. The dielectric fin cap 25 may have a thickness ranging from 1 nm to 100 nm. In one embodiment, the dielectric fin cap 25 is composed of an oxide, such as $SiO_2$, that is formed by chemical vapor deposition to a thickness on the order of 25 nm to 50 nm. In yet another embodiment, no dielectric fin cap 25 is present.

In one embodiment, following the formation of the layer of dielectric material that provides the dielectric fin cap 25, a photolithography and etch process sequence applied to the dielectric fin cap 25 and the SOI substrate may provide the fin structures 10a, 10b that are depicted in FIG. 1. Specifically, in one example, an etch mask is formed overlying the layer of the dielectric material that provides dielectric fin cap 25, and is present overlying the SOI layer of the substrate, in which the portion of the dielectric material that is underlying the etch mask provides the dielectric fin cap 25, and the portion of the SOI layer that is underlying the etch mask provides the fin structures 10a, 10b. The exposed portions of the dielectric material that provides dielectric fin cap 25 and the exposed portions of the SOI layer, which are not protected by the etch mask, are removed using a selective etch process. To provide the etch mask, a photoresist layer is first positioned on the layer of the dielectric material that provides dielectric fin cap 25. The photoresist layer may be provided by a blanket layer of photoresist material that is formed utilizing a deposition process such as, for example, CVD, PECVD, evaporation or spin-on coating. The blanket layer of photoresist material is then patterned to provide the etch mask utilizing a lithographic process that may include exposing the photoresist material to a pattern of radiation and developing the exposed photoresist material utilizing a resist developer.

Following the formation of the etch mask, an etching process may remove the unprotected portions of the dielectric material that provides the dielectric fin cap 25 followed by removing the unprotected portion of the SOI layer selective to the underlying buried insulating layer, i.e., dielectric substrate 15. For example, the transferring of the pattern provided by the etch mask into the underlying structures may include an anisotropic etch. The anisotropic etch may include reactive-ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. Alternatively, the fin structure 10a, 10b can be formed by a spacer imaging transfer technique.

Each fin structure 10a, 10b may have a height $H_1$ ranging from 5 nm to 200 nm. In one embodiment, the fin structures 10a, 10b each have a height $H_1$ ranging from 10 nm to 100 nm. In another embodiment, the fin structures 10a, 10b each have a height $H_1$ ranging from 20 nm to 50 nm. In one embodiment, the fin structures 10a, 10b each have a width $W_1$ of less than 20 nm. In another embodiment, the fin structures 10a, 10b each have a width $W_1$ ranging from 3 nm to 8 nm.

The distance D1 separating the fin structure 10a for the first conductivity semiconductor device, e.g., n-type finFET, and the second fin structure 10b for a second conductivity semiconductor device, e.g., p-type finFET, may range from 20 nm to 200 nm. In another embodiment, the distance D1 separating the fin structure 10a for the first conductivity semiconductor device, e.g., n-type finFET, and the second fin structure 10b for a second conductivity semiconductor device, e.g., p-type finFET, may range from 50 nm to 100 nm.

FIG. 1 further depicts forming a gate structure 20 on the fin structures 10a, 10b and the dielectric fin cap 25 that is present on the upper surface of each of the fin structures 10a, 10b. A "gate structure" means a structure used to control output current (i.e., flow of carriers in the channel) of a semiconducting device through electrical or magnetic fields. In one embodiment, the gate structure 20 includes a gate dielectric 21 in contact with at least a channel portion of the fin structures 10a, 10b, a gate conductor 22 on the gate dielectric 21, and a gate dielectric cap 23 present atop the gate conductor 22. The channel portion of the fin structures 10a, 10b is the region underlying the gate structure 20 and between the source and drain of the finFET semiconductor devices that become conductive when the semiconductor device is turned on. The gate structure 20 may be formed by forming blanket material layers for the gate dielectric 21, the gate conductor 22, and the gate dielectric cap 23 to provide a gate stack, and patterning and etching the gate stack to provide the gate structure 20. The gate structure 20 can be formed utilizing photolithography and etch process steps. Specifically, a pattern is produced by applying a photoresist to the surface to be etched; exposing the photoresist to a pattern of radiation; and then developing the pattern into the photoresist utilizing conventional resist developer. Once the patterning of the photoresist is completed, the sections covered by the photoresist are protected while the exposed regions are removed using a selective etching process that removes the unprotected regions. In one embodiment, the portion of the gate stack that is removed to provide the gate structure 20 exposes the sidewalls S1, S2 of each of the fin structures 10a, 10b.

The gate dielectric 21 is typically positioned on at least a portion of the sidewalls S1, S2 of the fin structures 10a, 10b. The gate dielectric 21 may be formed by a thermal growth process such as, for example, oxidation, nitridation or oxynitridation. The gate dielectric 21 may also be formed by a deposition process such as, for example, chemical vapor deposition (CVD), plasma-assisted CVD, metal organic chemical vapor deposition (MOCVD), atomic layer deposition (ALD), evaporation, reactive sputtering, chemical solution deposition and other like deposition processes. In one embodiment, the gate dielectric 21 is deposited using a conformal deposition process. The term "conformal" denotes a layer having a thickness that does not deviate from greater than or less than 20% of an average value for the thickness of the layer. The gate dielectric 21 may also be formed utilizing any combination of the above processes.

The gate dielectric 21 may be comprised of an insulating material having a dielectric constant of 4.0 or greater. In another embodiment, the gate dielectric 21 is comprised of an insulating material having a dielectric constant greater than 7.0. The dielectric constants mentioned herein are relative to a vacuum at room temperature. In one embodiment, the gate dielectric 21 employed in the present disclosure includes, but is not limited to, an oxide, nitride, oxynitride and/or silicates including metal silicates, aluminates, titanates and nitrides. In one example, when the gate dielectric 21 is comprised of an oxide, the oxide may be selected from the group including, but not limited to $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the gate dielectric 21 may vary, but typically, the gate dielectric 21 has a thickness ranging from 1 nm to 10 nm. In another embodiment, the gate dielectric 21 has a thickness ranging from 1 nm to 3 nm.

After forming the gate dielectric 21, the gate conductor 22 of the gate structure 20 is formed on the gate dielectric 21 utilizing a deposition process, such as physical vapor deposition (PVD), CVD or evaporation. The gate conductor 22 may be composed of polysilicon, SiGe, a silicide, a metal or a metal-silicon-nitride, such as Ta—Si—N. Examples of metals that can be used as the gate conductor 22 include, but are not limited to Al, W, Cu, Ti or other like conductive metals. In one embodiment, the gate conductor 22 comprises Ti, Zr, Hf, V, Nb, Ta, TiN, TaN or a combination thereof. The gate conductor 22 may be doped or undoped. The physical thickness of the gate conductor 22 may range from 1 nm to 10 nm. In another embodiment, the gate conductor 22 has a thickness ranging from 1 nm to 3 nm.

The gate dielectric cap 23 may be composed of a nitride, oxide, oxynitride material, and/or any other suitable dielectric layer. In one example, the gate dielectric cap 23 is composed of silicon oxide formed by thermal oxidation. The gate dielectric cap 23 may comprise a single layer of dielectric material or multiple layers of dielectric materials. The dielectric layer can be formed by a deposition process, such as chemical vapor deposition (CVD) and/or atomic layer deposition (ALD). Alternatively, the gate dielectric cap 23 may be formed using a growth process, such as thermal oxidation or thermal nitridation. The gate dielectric cap 23 may have a thickness ranging from 1 nm to 100 nm. In one embodiment, the gate dielectric cap 23 is composed of a nitride, such as SiN, that is formed by chemical vapor deposition to a thickness on the order of 25 nm to 50 nm.

Figure 2:
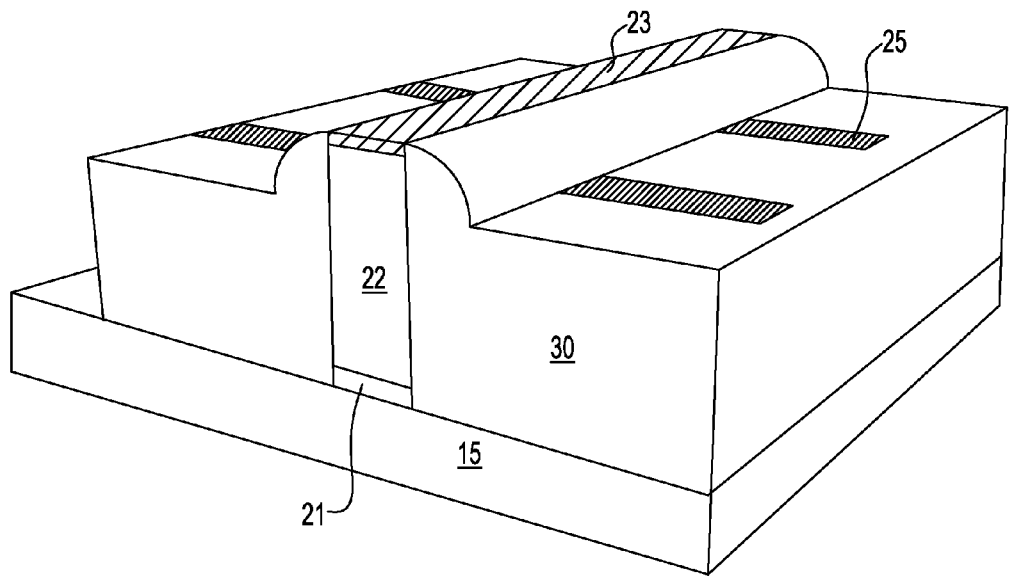
FIG. 2 is a perspective view depicting forming a blanket dielectric over the first fin structure and the second fin structure, in accordance with one embodiment of the present disclosure.

FIG. 2 depicts one embodiment of forming a blanket dielectric 30 over the first fin structure 10a and the second fin structure 10b. The blanket dielectric 30 has a material composition that provides the material for the spacers to the gate structure 20. Any dielectric material may be suitable for the blanket dielectric 30. In some instances, the composition of the blanket dielectric 30 is selected so that is may be etched selective to at least one of the gate dielectric cap 23, the dielectric fin cap 25 and the substrate 15. As used herein, the term "selective" in reference to a material removal process denotes that the rate of material removal for a first material is greater than the rate of removal for at least another material of the structure to which the material removal process is being applied. In some embodiments, the composition of the blanket dielectric 30 may be an oxide, nitride or oxynitrides. In one example, the blanket dielectric 30 is composed of silicon nitride. The blanket dielectric may be deposited using any deposition process, such as chemical vapor deposition, e.g., plasma enhanced chemical vapor deposition (PECVD) or high density plasma chemical vapor deposition (HDPCVD), chemical solution deposition, spin on deposition, chemical solution deposition, evaporation and combination thereof. The thickness of the blanket dielectric 30 is selected to cover the at least the fin structures 10a, 10b, and may also cover the gate structure 20. In some embodiments, following deposition the upper surface of the blanket dielectric 30 may be recessed to expose the upper surface of the gate dielectric cap 23 and the dielectric fin cap 25, as depicted in FIG. 2. The upper surface of the blanket dielectric 30 may be recessed using an anisotropic etch, such as reactive ion etch (RIE). The anisotropic etch may be a timed etch, or the anisotropic etch may be terminated using end point detection.

Figure 3:
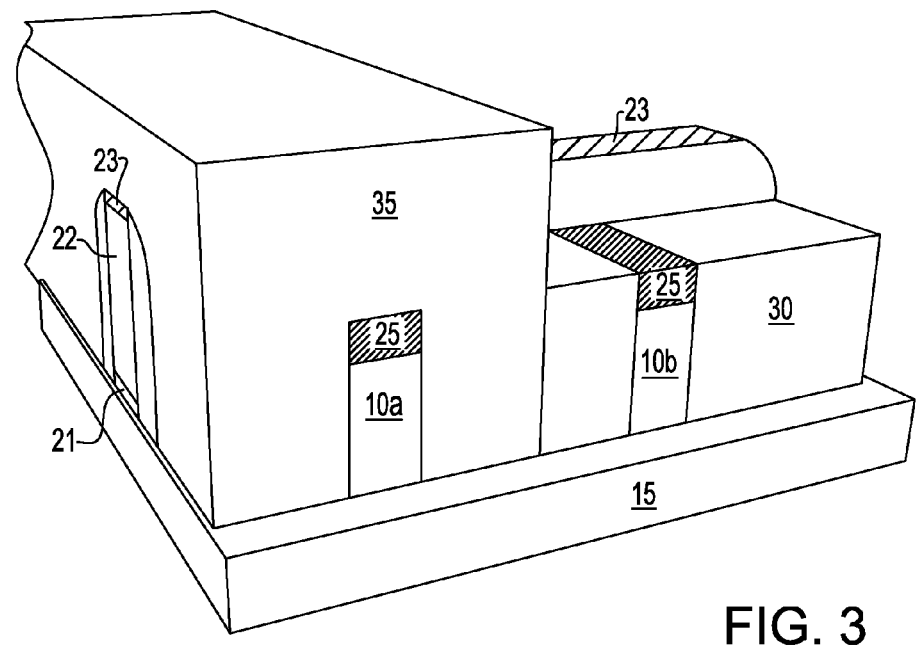
FIG. 3 is a perspective view depicting forming a first photoresist mask overlying at least the first fin structure, wherein the second fin structure is exposed, in accordance with one embodiment of the present disclosure.

FIG. 3 depicts one embodiment of forming a first photoresist mask 35 overlying at least the first fin structure 10a, wherein the second fin structure 10b is exposed. For example, a photoresist block mask, i.e., first photoresist mask 35, can be formed by applying a photoresist layer to the surface of blanket dielectric 30, exposing the photoresist layer to a pattern of radiation, and then developing the pattern into the photoresist layer utilizing a resist developer. The remaining portion of the photoresist layer following development provides the first photoresist mask 35.

Figure 4:
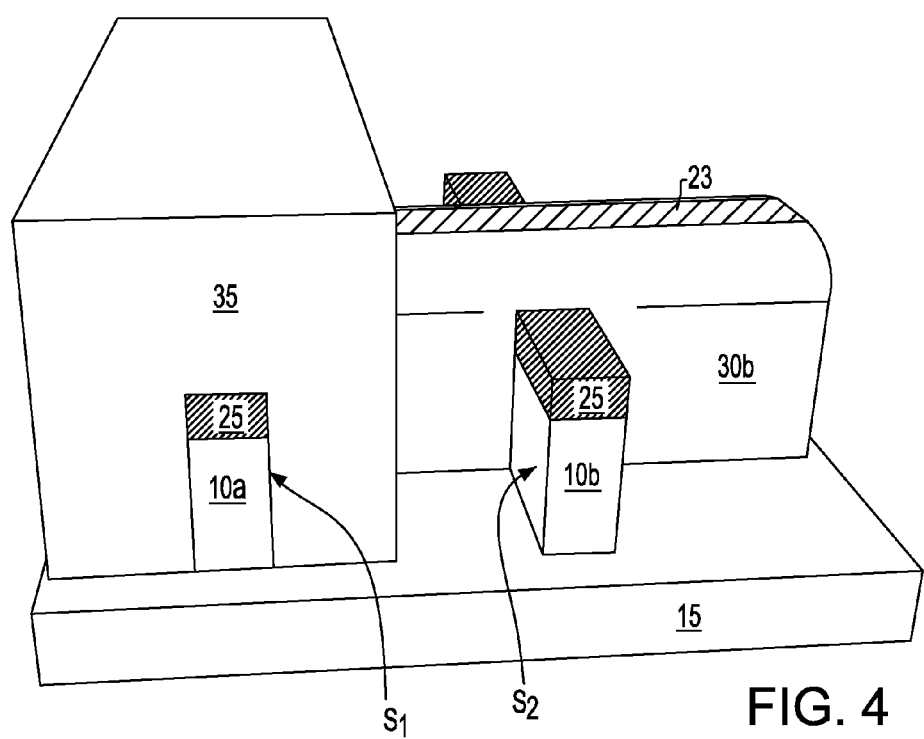
FIG. 4 is a perspective view depicting one embodiment of removing a portion of the blanket dielectric to expose at least the sidewalls of the second fin structure, wherein a remaining portion of the blanket dielectric covers at least the sidewalls of the first fin structure, in accordance with the present disclosure.

FIG. 4 depicts one embodiment of removing a portion of the blanket dielectric to expose at least sidewalls S2 of the second fin structure 10b, wherein a remaining portion of the blanket dielectric 30 covers at least sidewalls S1 of the first fin structure 10a. The exposed portions of the blanket dielectric 30 are then removed using a selective etch process. More specifically, the exposed portions of the blanket dielectric 30 are removed with an etch chemistry that is selective to at least the first photoresist mask 35, the gate dielectric cap 23, and the dielectric fin cap 25. The etch selectivity for removing the material of the blanket dielectric 30 to the first photoresist mask 35, the gate dielectric cap 23, and the dielectric fin cap 25 may be greater than 100:1. In some embodiments, the etch that removes the exposed portion of the blanket dielectric 30 is also selective to the dielectric substrate 15. The etch process for removing the exposed portions of the blanket dielectric 30 may be an anisotropic etch process, such as reactive ion etch (RIE). Other examples of anisotropic etch processes that are suitable for removing the exposed portions of the blanket dielectric 30 include ion beam etching, plasma etching and/or laser ablation.

In one embodiment, following etching of the blanket dielectric, a first section (not depicted in FIG. 4) of the remaining portion of the blanket dielectric remains underlying the first photoresist mask 35, and a second section 30b of the remaining portion of the blanket dielectric provides a second spacer present on the gate structure 20 that is abutting the second fin structure 10b. In some embodiments, the second section 30b of the remaining portion of the blanket dielectric is recessed by the anisotropic etch that removes the majority of the blanket dielectric 30 that is not protected by the first photoresist mask 35. Because the height of the blanket dielectric 30 that is adjacent to the gate structure 20 is greater than the height of the blanket dielectric 30 that is separated from the gate structure 20, the portion of the blanket dielectric 30 adjacent to the gate structure 20 is recessed, but not removed in it's entirety, by the time the anisotropic etch completely removes the portion of the blanket dielectric that is separated from the gate structure 20. In one example, the second section 30b of the remaining portion of the blanket dielectric provides a second spacer present on the gate structure 20 that may have a width ranging from 1 nm to 10 nm, typically ranging from 1 nm to 5 nm.

Figure 5:
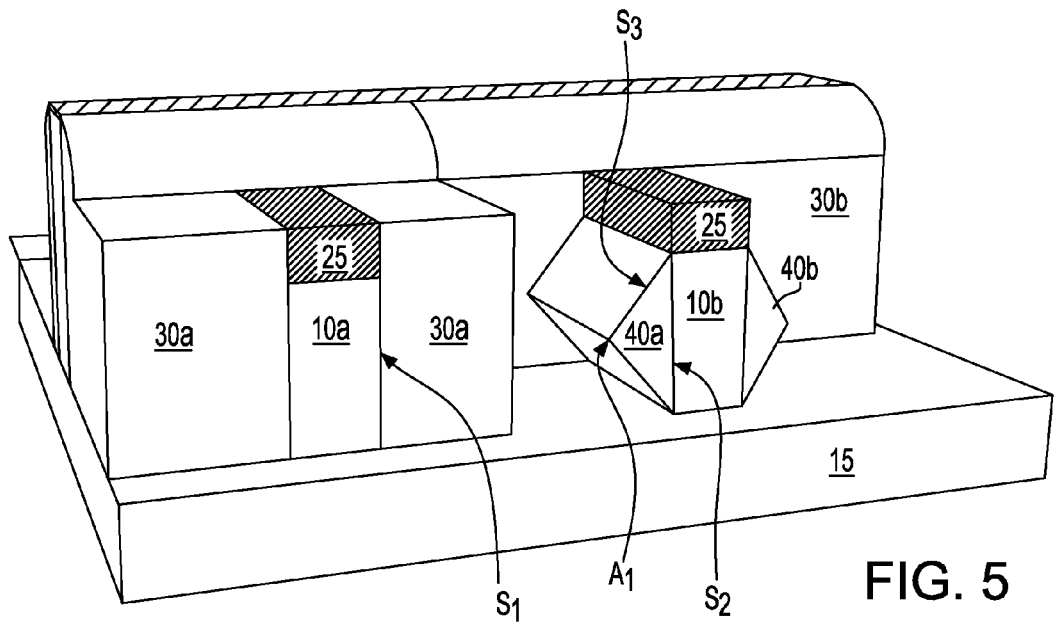
FIG. 5 is a perspective view depicting epitaxially forming in-situ doped second source and drain regions having a facetted exterior sidewall on the sidewalls of the second fin structure, wherein the remaining portion of the blanket dielectric obstructs epitaxial growth on the sidewalls of the first fin structure, in accordance with one embodiment of the present disclosure.

FIG. 5 depicts one embodiment of epitaxially forming in-situ doped second source and drain regions 40a, 40b having a facetted exterior sidewall S3 on the sidewalls S2 of the second fin structure 10b, in which the remaining portion of the blanket dielectric, i.e., first section 30a of the remaining portion of the blanket dielectric, obstructs epitaxial growth on the sidewalls S1 of the first fin structure 10a. "Epitaxially forming, epitaxial growth and/or deposition" means the growth of a semiconductor material on a deposition surface of a semiconductor material, in which the semiconductor material being grown has the same crystalline characteristics as the semiconductor material of the deposition surface. When the chemical reactants are controlled and the system parameters set correctly, the depositing atoms arrive at the surface of the sidewalls S2 of the second fin structure 10b with sufficient energy to move around on the surface and orient themselves to the crystal arrangement of the atoms of the deposition surface.

In one embodiment, the epitaxially formed in-situ doped second source and drain regions 40a, 40b are composed of a silicon base material. A number of different sources may be used for the deposition of epitaxial silicon. In some embodiments, the silicon sources for epitaxial growth include silicon tetrachloride, dichlorosilane ($SiH_2Cl_2$), and silane ($SiH_4$). The temperature for epitaxial silicon deposition typically ranges from 550° C. to 900° C. Although higher temperature typically results in faster deposition, the faster deposition may result in crystal defects and film cracking.

In another embodiment, the epitaxially formed in-situ doped second source and drain regions 40a, 40b are composed of a silicon germanium base material. A number of different sources may be used for the deposition of epitaxial silicon germanium. In some embodiments, the gas source for the deposition of epitaxial SiGe may include a mixture of silane ($SiH_4$), and germane ($GeH_4$) gas. In-situ doped semiconductor material may be provided by selective-epitaxial growth of SiGe on the sidewall S2 the second fin structure 10b. The Ge content of the epitaxial grown SiGe may range from 5% to 60%, by atomic weight %. In another embodiment, the Ge content of the epitaxial grown SiGe may range from 10% to 40%. The epitaxially grown SiGe may be under an intrinsic compressive strain, in which the compressive strain is produced by a lattice mismatch between the larger lattice dimension of the SiGe and the smaller lattice dimension of the layer on which the SiGe is epitaxially grown. In one embodiment, the epitaxially grown SiGe produces a compressive strain in the portion of the fin structure 10b, in which the channel of a semiconductor device, such as a p-type finFET device, is subsequently formed.

In another embodiment, the epitaxially formed in-situ doped second source and drain regions 40a, 40b are composed of epitaxially grown Si:C or carbon doped silicon. The carbon (C) content of the epitaxial grown Si:C ranges from 0.3% to 5%, by atomic weight %. In another embodiment, the carbon (C) content of the epitaxial grown Si:C may range from 1% to 2%. The epitaxial grown Si:C may be under an intrinsic tensile strain, in which the tensile strain is produced by a lattice mismatch between the smaller lattice dimension of the Si:C and the larger lattice dimension of the layer on which the Si:C is epitaxially grown. In one embodiment, the epitaxial grown Si:C produces a tensile strain in the portion of the fin structure 10b, in which the channel of a semiconductor device, such as an n-type finFET device, is subsequently formed.

The term "in-situ doped" means that the dopant that provides the conductivity of the epitaxially formed in-situ doped second source and drain regions 40a, 40b is introduced during the epitaxial growth process. In one embodiment, the in-situ doped semiconductor material is doped with a second conductivity type dopant during the epitaxial growth process. As used herein, the term "conductivity type" denotes a dopant region being p-type or n-type. As used herein, "p-type" refers to the addition of impurities to an intrinsic semiconductor that creates deficiencies of valence electrons. In a silicon-containing fin structure 10a, 10b, examples of n-type dopants, i.e., impurities, include but are not limited to, boron, aluminum, gallium and indium. As used herein, "n-type" refers to the addition of impurities that contributes free electrons to an intrinsic semiconductor. In a silicon containing fin structure 10a, 10b, examples of n-type dopants, i.e., impurities, include but are not limited to antimony, arsenic and phosphorous.

P-type finFET devices are produced by doping the epitaxially formed in-situ doped second source and drain regions 40a, 40b with elements from group III of the Periodic Table of Elements. In one embodiment, the group III element is boron, aluminum, gallium or indium. In one example, in which the in-situ doped semiconductor material is doped to provide a p-type conductivity, the dopant may be boron present in a concentration ranging from $1\times10^{19}$ atoms/cm$^3$ to $2\times10^{21}$ atoms/cm$^3$. In one example, the in-situ doped semiconductor material is composed of SiGe and is doped with boron to provide the raised source and drain regions of a p-type conductivity finFET.

In one embodiment, the epitaxially formed in-situ doped second source and drain regions 40a, 40b may also be doped to an n-type conductivity to provide the source and drain regions to an n-type finFET device. N-type finFET devices are produced by doping the epitaxially formed in-situ doped second source and drain regions 40a, 40b with elements from group V of the Periodic Table of Elements. In one embodiment, the group V element is phosphorus, antimony or arsenic.

In one embodiment, the epitaxial growth process is selected so that the epitaxially formed in-situ doped second source and drain regions 40a, 40b have a facetted exterior sidewall S3 present on the sidewalls S2 of the second fin structure 10b. The term "facetted" means each of the surfaces of the exterior sidewall are disposed along a crystalline orientation of the epitaxially formed semiconductor material that provides the in-situ doped second source and drain regions 40a, 40b. In one embodiment, the facetted exterior sidewall S3 of the epitaxially grown in-situ doped source and drain regions 40a, 40b provide source and drain regions 40a, 40b each having a triangular cross section with an apex A1 opposite the sidewalls S2 of the second fin structure 10b. When viewed together, the cross section of the source region 40a and the drain region 4b on the second fin structure 10b resembles a diamond. In one embodiment, the interior face of the epitaxial portion of each of the source and drain regions, i.e., epitaxially grown in-situ doped source and drain regions 40a, 40b, that is in direct contact with the sidewalls S2 of the second fin structure 10b has a (110) crystal orientation. In one embodiment, the face of the epitaxial portion of each of the source and drain regions, i.e., epitaxially grown in-situ doped source and drain regions 40a, 40b, that intersect to form the apex A1 of the facetted exterior sidewall S3 each have a (111) crystal orientation.

In one example, the epitaxially formed in-situ doped second source and drain regions 40a, 40b have each have a triangular cross-section with a facetted exterior sidewall S3, wherein the source and drain regions 40a, 40b are composed of silicon germanium (SiGe) and are doped to a p-type conductivity, in which the facetted exterior sidewall S3 includes two facets each have a (111) crystal orientation and the interior face of the source and drain regions 40a, 40b has a (110) crystal orientation.

The faceted (111) orientation can be formed by using an epitaxy process that has different epitaxy growth rates at different crystal orientations. The epitaxy process actually contains two components, i.e., a growth process and an etching process. The etching component of the epitaxial process removes any defective film deposited. The etching process itself contains HCl gas and has different etch rates on different crystalline orientations. The surfaces having the (111) orientation have the slowest etch rate, so it remains in the end of the epitaxial process, appearing as the facetted exterior sidewall S3. In one example, when the epitaxially grown in-situ doped source and drain regions 40a, 40b are composed of silicon, the epitaxial growth process comprises a growth process provided by the introduction of silicon tetrachloride, and an etch process composed of HCl gas, in which the epitaxial growth process and the etch process are cycled until the epitaxially grown in-situ doped source and drain regions 40a, 40b are formed on the sidewalls S2 of the second fin structure 10b. In another example, when the epitaxially grown in-situ doped source and drain regions 40a, 40b are composed of silicon germanium, the epitaxial growth process comprises a growth process provided by the introduction of silicon tetrachloride and germane gas, and an etch process composed of HCl gas, in which the epitaxial growth process and the etch process are cycled until the epitaxially grown in-situ doped source and drain regions 40a, 40b are formed on the sidewalls S2 of the second fin structure 10b.

During the growth of the epitaxially formed in-situ doped second source and drain regions 40a, 40b, epitaxial material is obstructed from forming on the first fin structure 10a by the first section 30a of the remaining portion of the blanket dielectric, as well as the dielectric fin cap 25 (when exposed) that is present on the upper surface of the first fin structure 10a. The gate dielectric cap 23 obstructs epitaxial growth on the gate conductor 22.

In some embodiments, following the formation of the epitaxially formed in-situ doped second source and drain regions 40a, 40b, dopant from the in-situ doped semiconductor material, i.e., in-situ doped second source and drain regions 40a, 40b, is diffused into the second fin structure 10b to form extension regions. In one embodiment, the dopant from the in-situ doped semiconductor material is diffused into the second fin structure 10b by an annealing processes including, but not limited to, rapid thermal annealing, furnace annealing, flash lamp annealing or laser annealing. In one embodiment, thermal annealing to diffuse the dopant from the in-situ doped semiconductor material into the second fin structure 10b is conducted at a temperature ranging from about 850° C. to about 1350° C.

In one embodiment, in which the epitaxially formed in-situ doped second source and drain regions 40a, 40b are doped to a p-type conductivity, the extension regions that are formed in the second fin structure 10b have a p-type conductivity. In another embodiment, in which the epitaxially formed in-situ doped second source and drain regions 40a, 40b are doped to an n-type conductivity, the extension regions that are formed in the second fin structure 10b have an n-type conductivity. Typically, the dopant concentration of the extension regions ranges from $1\times10^{19}$ atoms/cm$^3$ to $5\times10^{20}$ atoms/cm$^3$. In another embodiment, the extension regions have a dopant concentration ranging from $2\times10^{19}$ atoms/cm$^3$ to $2\times10^{20}$ atoms/cm$^3$. Because the extension regions in the second fin structure 10b are not formed using ion implantation, the present disclosure does not damage the sidewalls S2 of the second fin structure 10b during the formation of the extension region.

Figure 6:
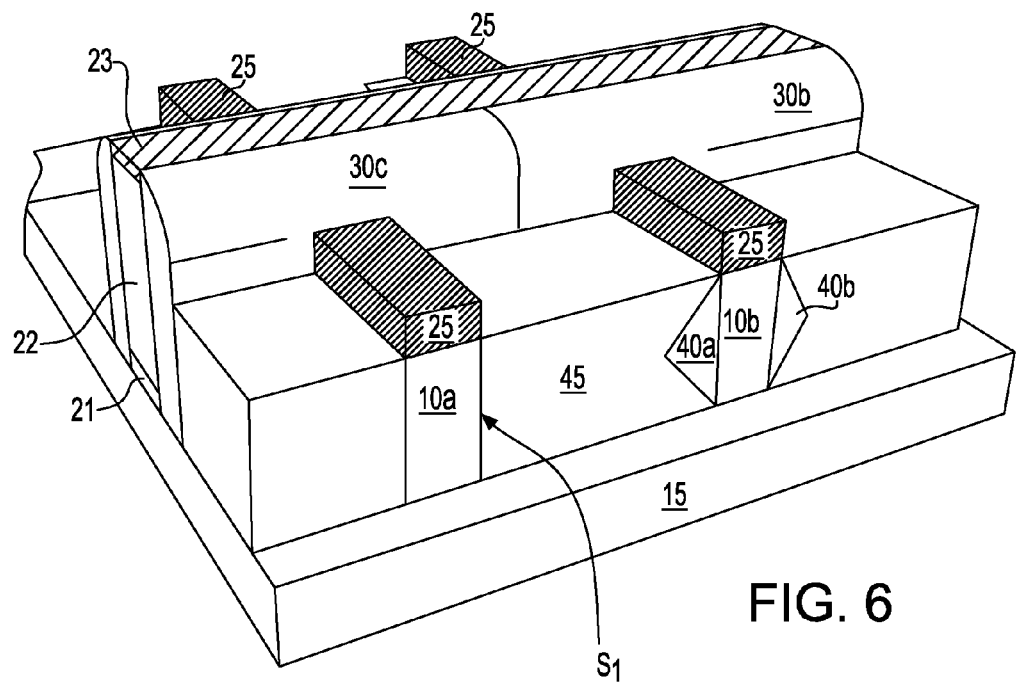
FIG. 6 is a perspective view depicting one embodiment of removing the remaining portion of the blanket dielectric to expose at least the sidewalls of the first fin structure, forming extension regions in the sidewalls of the first fin structure using an angled ion implant, and epitaxially growing a non-doped semiconductor layer on the first fin structure and the second fin structure, in accordance with the present disclosure.

FIGS. 5 and 6 depict one embodiment of removing the majority of the remaining portion of the blanket dielectric, i.e., remaining first section 30a, to expose at least the sidewalls S1 of the first fin structure 10a. In one embodiment, removing the remaining portion of the blanket dielectric to expose at least the sidewalls S1 of the first fin structure 10a includes forming a second photoresist mask (now shown) over the second fin structure 10b, and anisotropically etching the first section 30a of the remaining portion of the blanket dielectric, wherein a remaining section 30c of the first section 30a of the remaining portion of the blanket dielectric provides a first spacer adjacent to the first fin structure 10a. The second photoresist mask is similar in composition and method of formation as the first photoresist mask 35 that is described above with reference to FIG. 3. Therefore, the above description of first photoresist mask 35 depicted in FIG. 3 is suitable for the second photoresist mask.

Anisotropic etching of the first section 30a of the remaining portion of the blanket dielectric may be a selective etch that is similar to the etch process for removing the exposed portion of the blanket dielectric 30 that is described above with reference to FIGS. 3 and 4. Following anisotropic etching, the remaining section 30c of the blanket dielectric provides the first spacer that is adjacent to the sidewall S1 of the first fin structure 10a. In one embodiment, the first spacer may have a width ranging from 1 nm to 10 nm. In another embodiment, the first spacer has a width ranging from 1 nm to 5 nm.

It is noted that the first and second spacers are formed from a single blanket deposited material, wherein the material that provides the first and second spacers is employed as a hard mask for a selective epitaxial growth process, i.e., the formation of the epitaxially formed in-situ doped second source and drain regions 40a, 40b. This process sequence reduces the number of hard masking steps for forming the epitaxially formed in-situ doped second source and drain regions 40a, 40b. In one embodiment, because the above-described process sequence reduces the number of hard masks, the present disclosure substantially reduces or eliminates process complexity, such as undercutting of the dielectric substrate 15 that the first and second fin structures 10a, 10b are present on, therefore reducing the incidence by which the fin structures 10a, 10b may lift off of the substrate 15. Further, by reducing damage to the substrate 15 and divot formation, the present disclosure substantially reduces or eliminates source-to-drain shorting.

In one embodiment, once the sidewalls S1 of the first fin structure 10a have been exposed, extension regions may be formed in the sidewalls S1 of the first fin structure 10a using an angled ion implant. It is noted that any angle is suitable for the angled ion implantation, so long as the majority of dopant is introduced to the sidewalls S1 of the first fin structure 10a. The dopant composition implanted by the angled ion implantation may be an n-type dopant, such as arsenic and phosphorus, or a p-type dopant, such as BF$_2$ or aluminum. Typically, when the second fin structure 10b provides a p-type finFET, the angled ion implantation introduces an n-type dopant into the sidewalls S1 of the first fin structure 10a to provide the extension region of an n-type finFET. In one example, the angled implant may include a phosphorus dopant and a dosage ranging from $1\times10^{13}$ atoms/cm$^2$ to $5\times10^{15}$ atoms/cm$^2$. In one embodiment, the angled implant is carried out using an ion implant apparatus that operates at an energy ranging from 5.0 keV to 60.0 keV. The angled implant may be carried out at a temperature ranging from 50° C. to 800° C. Following formation of the extension regions in the first fin structure 10a, the second photoresist mask may be removed. The second photoresist mask may be removed using selective etching, chemical strip or oxygen ashing.

FIG. 6 depicts one embodiment of epitaxially growing a non-doped semiconductor layer 45 in contact with the sidewall S1 of the first fin structure 10a and the epitaxially formed in-situ doped second source and drain regions 40a, 40b that are present on the second fin structure 10b. By "non-doped" it is meant that the base semiconductor material, i.e., epitaxially grown material 45, is not doped with an n-type or p-type dopant as it is being formed. The non-doped semiconductor layer 45 may be composed of silicon, silicon germanium and silicon doped with carbon (Si:C).

The non-doped semiconductor layer 45 is formed using an epitaxial growth process that is similar to the epitaxial growth process that has been described above with reference to FIG. 5. Therefore, with the exception that the in-situ doping component of the epitaxially formed in-situ doped second source and drain regions 40a, 40b, the method described above for forming the epitaxially formed in-situ doped second source and drain regions 40a, 40b is suitable for forming the non-doped semiconductor layer 45. In one embodiment, the non-doped semiconductor layer 45 is a continuous layer that is in contact with both the first and second fin structures 10a, 10b, as depicted in FIG. 6. In another embodiment, the portion of the non-doped semiconductor layer 45 that is present in contact with the first fin structure 10a is separate from the portion of the non-doped semiconductor layer 45 that is present in contact with the second fin structure 10b.

Figure 7:
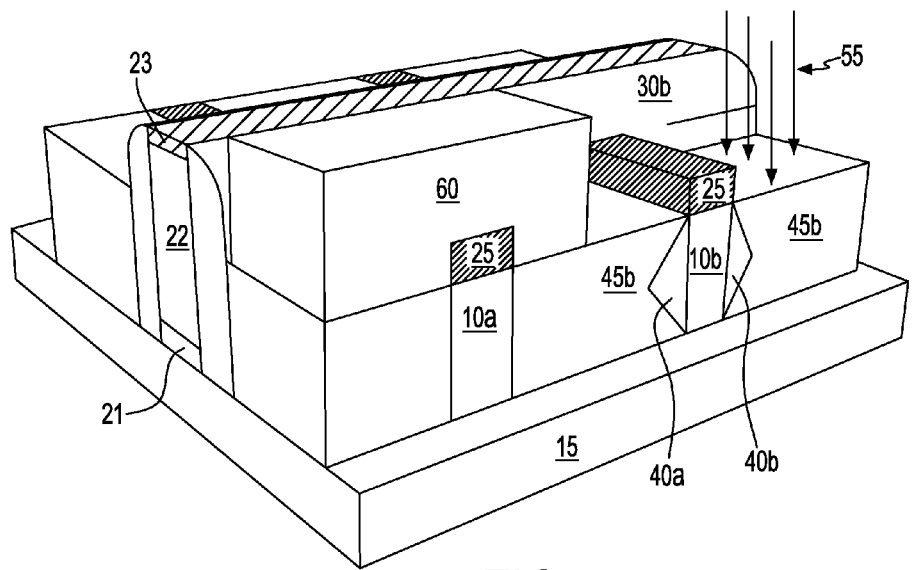
FIG. 7 is a perspective view depicting one embodiment of implanting the non-doped semiconductor layer that is in direct contact with the epitaxially formed in-situ doped second source and drain regions having the facetted exterior sidewall to provide a second contact, in accordance with the present disclosure.

FIG. 7 depicts one embodiment of implanting 55 the portion of the non-doped semiconductor layer 45 that is in direct contact with the epitaxially formed in-situ doped second source and drain regions 40a, 40b having the facetted exterior sidewall S3 to provide a second contact 45b. The non-doped semiconductor layer 45 may be implanted using ion implantation. In one embodiment, prior to implanting 55 the dopant into the non-doped semiconductor layer 45, a third photoresist mask 60 is formed over and protecting the non-doped semiconductor layer 45 that is adjacent to the first fin structure 10a, wherein the portion of the non-doped semiconductor layer 45 that is adjacent to the second fin structure 10b is exposed. The third photoresist mask 60 is similar in composition and method of formation as the first photoresist mask 35 that is described above with reference to FIG. 3. Therefore, the above description of first photoresist mask 35 depicted in FIG. 3 is suitable for the third photoresist mask 60. The non-doped layer 45 that is adjacent to the second fin structure 10b may be doped to have the same conductivity as the epitaxially formed in-situ doped second source and drain regions 40a, 40b. For example, when the epitaxially formed in-situ doped second source and drain regions 40a, 40b have a p-type conductivity, the non-doped layer 45 that is adjacent to the second fin structure 10b may be implanted with a p-type dopant, such as boron. Following implantation of the non-doped layer 45 that is adjacent to the second fin structure 10b, the third photoresist mask 60 may be removed using selective etching, chemical strip or oxygen ashing.

Figure 8:
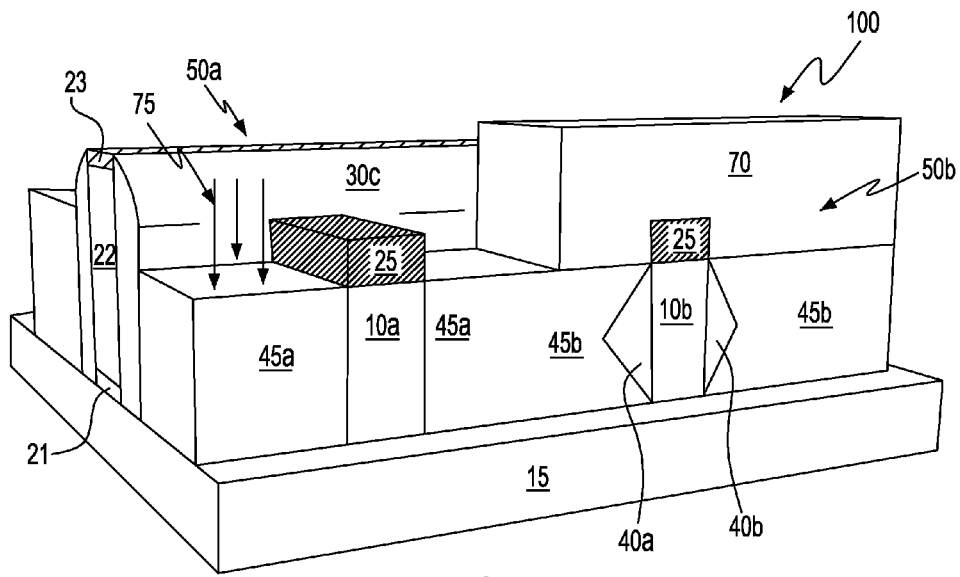
FIG. 8 is a perspective view depicting on embodiment of implanting the non-doped semiconductor layer that is in direct contact with the extension regions in the first fin structure to provide a first contact, in accordance with the present disclosure.

FIG. 8 depicts one embodiment of implanting 75 the non-doped semiconductor layer 45 that is in direct contact with the extension regions in the first fin structure 10a to provide a first contact 45a. The non-doped semiconductor layer 45 may be implanted using ion implantation. In one embodiment, prior to implanting 75 the dopant into the non-doped semiconductor layer 45, a fourth photoresist mask 70 is formed over and protecting the second contact 45b that is adjacent to the second fin structure 10b, wherein the non-doped semiconductor layer 45 that is adjacent to the first fin structure 10a is exposed. The fourth photoresist mask 70 is similar in composition and method of formation as the first photoresist mask 35 that is described above with reference to FIG. 3. Therefore, the above description of first photoresist mask 35 depicted in FIG. 3 is suitable for the fourth photoresist mask 70. The non-doped layer 45 that is adjacent to the first fin structure 10a may be doped to have the same conductivity as the extension regions within the first fin structure 10a. For example, when the extension regions in the first fin structure 10a have an n-type conductivity, the non-doped layer 45 that is adjacent to the first fin structure 10a may be implanted with a n-type dopant, such as phosphorus, to provide the first contact 45a. Following implantation of the non-doped layer 45 that is adjacent to the first fin structure 10a, the fourth photoresist mask 70 may be removed using selective etching, chemical strip or oxygen ashing.

FIG. 8 depicts one embodiment of a CMOS semiconductor device 100 of finFET devices 50a, 50b, in which the source and drain regions of one of the finFET devices, such as a p-type finFET device 50b, includes an epitaxial portion having a facetted exterior sidewall, e.g., epitaxially formed in-situ doped second source and drain regions 40a, 40b. In one embodiment, the CMOS semiconductor device 100 includes a first finFET, e.g., n-type finFET 50a, on a first portion of the substrate 15, and a second finFET, e.g., p-type finFET 50b, on a second portion of the substrate 15.

The first finFET includes first source and drain regions of a first conductivity, e.g., n-type conductivity. The first source and drain regions include first extension portions in sidewalls of a first fin structure 10a of the first finFET and first contact portions 45a in direct contact with the first extension portions of the first source and drain regions. 15. The first source and drain regions of the first conductivity do not include epitaxial portions having a facetted exterior sidewall.

The second finFET includes source and drain regions of a second conductivity, e.g., p-type conductivity. The source and drain regions of the second conductivity may include second extension portions in sidewalls of a second fin structure 10b of the second finFET, epitaxial portions 40a, 40b having a facetted exterior sidewall S3 present on the sidewalls S2 of the fin structure 10b, and second contact portions 45b in direct contact with the epitaxial portions 40a, 40b of the source and drain regions.

In another aspect, the present disclosure provides a finFET structure, and method of forming thereof, that includes extension regions having a doped sidewall with a uniform dopant density along the width (perpendicular to the plane of the wafer) orientation of the extension regions. In one embodiment, extension regions with a uniform density along their width are provided by in situ doped epitaxial regrowth process following a lateral recess of the fin structure, as described below with reference to FIGS. 9-11B.

Figure 9:
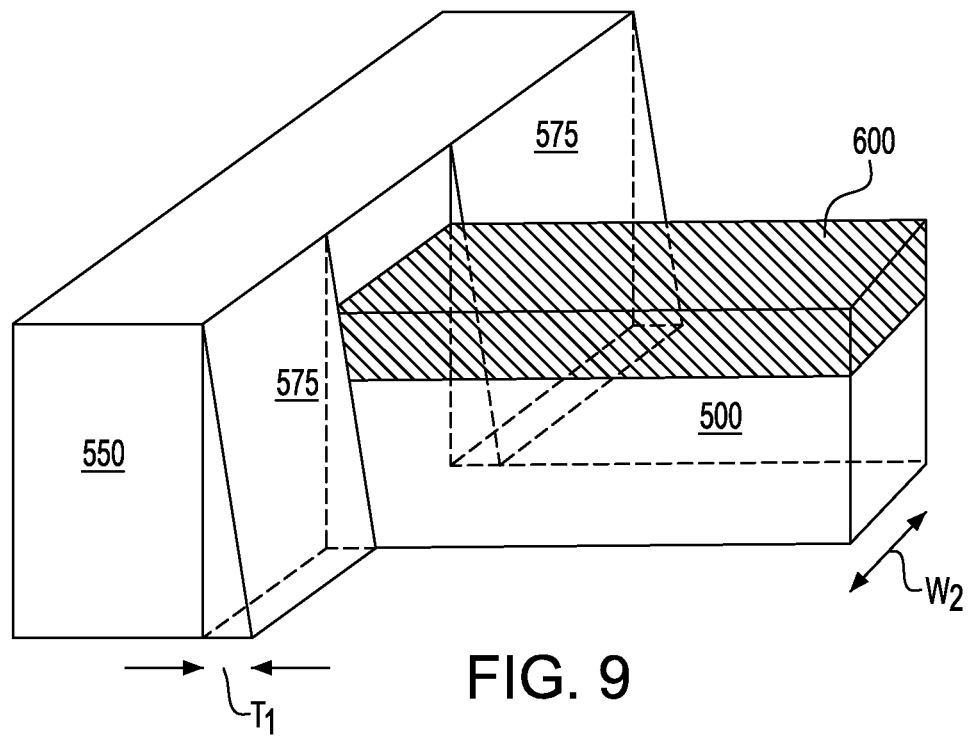
FIG. 9 is a perspective view of one embodiment of fin structure for forming a finFET semiconductor device, in which a dielectric cap is present on the upper surface of the fin structure, in accordance with the present disclosure.

FIG. 9 depicts one embodiment of fin structure 500 for forming a finFET semiconductor device, in which a dielectric cap 600 is present on the upper surface of the fin structure 500. Although not depicted in FIG. 9, the fin structure 500 may be present on a substrate, such as a dielectric substrate. Although FIG. 9 only depicts one fin structure 500, it is noted that any number of fin structures 500 may be present on a single dielectric substrate. The fin structure 500 that is depicted in FIG. 9 is similar to the fin structures 10a, 10b that are described with reference to FIG. 1. Therefore, the description of the fin structures 10a, 10b depicted in FIG. 1 is suitable for the fin structure 500 that is depicted in FIG. 9. In one embodiment, the fin structure 500 is composed of a silicon-containing material that is doped to a first conductivity type or second conductivity type, e.g., n-type or p-type conductivity. The description of the dielectric fin cap 25 that is illustrated in FIG. 1 is suitable for the dielectric cap 600 that are depicted in FIG. 9. In one embodiment, the original width W2 of the fin structure 500 is of the critical dimension. In one embodiment, the original width W2 of the fin structure 500 ranges from 5 nm to 50 nm. In another embodiment, the original width W2 of the fin structure 500 ranges from 10 nm to 20 nm.

FIG. 9 further depicts a gate structure 550 on the fin structure 500. The gate structure 550 may include a gate dielectric, gate conductor and a gate dielectric cap, similar to the gate structure 20 that is described above with reference to FIG. 1. A spacer 575 may be formed on the sidewall of the gate structure 550. The spacer 575 may be composed of an oxide, nitride, or oxynitride material. The base of the spacer 575 may have a thickness T1 ranging from 1 nm to 10 nm, wherein the exterior sidewall of the spacer 575 tapers towards the upper surface of the gate structure 550. FIG. 9 only depicts one side of the fin structure 500 on one side of the gate structure 550. Although not depicted in FIG. 9, a portion of the fin structure 500 may also be present on the opposite side of the gate structure 550.

Figure 10A:
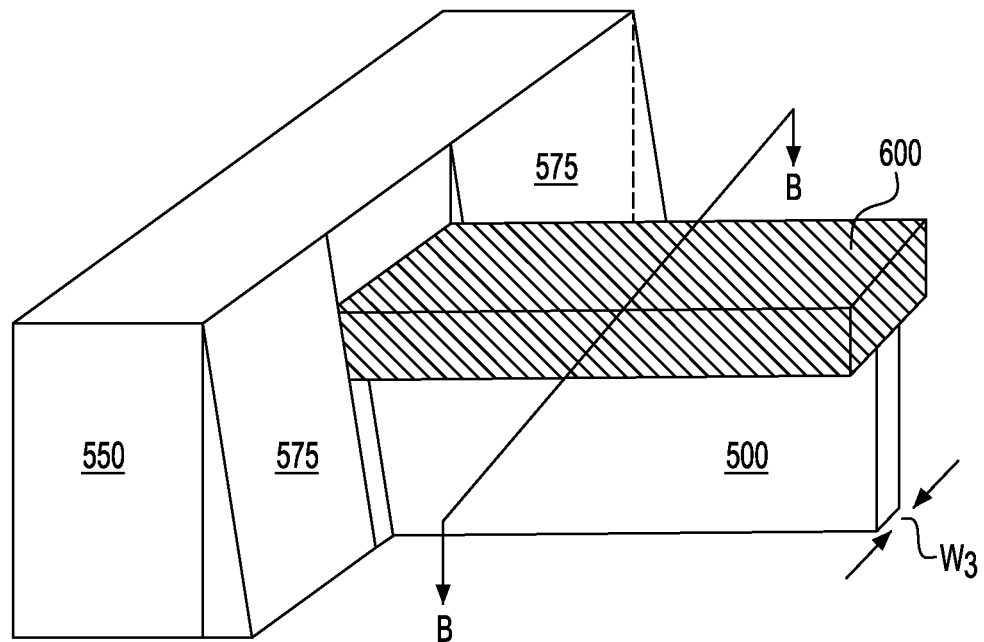
FIG. 10A is a perspective view of one embodiment of laterally etching the fin structure selective to the dielectric cap, wherein the laterally etching forms a recess underlying the dielectric cap, in accordance with the present disclosure.
Figure 10B:
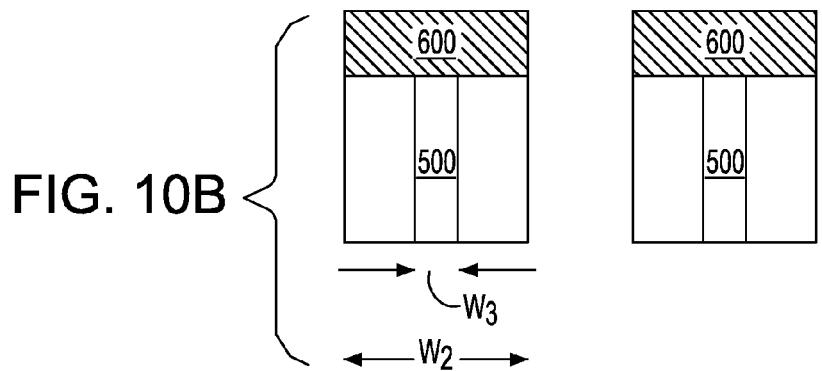
FIG. 10B is a side cross-sectional view of the structure depicted in FIG. 10A across section line B-B.

FIGS. 10A and 10B depict one embodiment of laterally etching the fin structure 500 selective to the dielectric cap 600. In one embodiment, "laterally etching" means that the majority of material that is being removed by the etch is in the direction that is parallel to the upper surface of the substrate on which the fin structure 500 is present. In one embodiment, the laterally etching forms a recess underlying the dielectric cap 600. In one embodiment, the recess is etched into the two opposing sides, i.e., sidewalls, of the fin structure 500, wherein the recess has a width that is greater than ¼ the original width W2 of the fin structure 500. Therefore, the remaining width W3 of the fin structure 500 is half, or less than half, the original width W2 of the fin structure 500 prior to laterally etching. In one embodiment, the remaining width W3 of the fin structure 500 ranges from 2 nm to 15 nm. In another embodiment, the remaining width W3 of the fin structure 500 ranges from 4 nm to 10 nm.

In one embodiment, the laterally etching the fin structure 500 selective to the dielectric cap 600 comprises a wet etch comprising at least one of following etchants: ammonia ($NH_4OH$), hydroperoxide ($H_2O_2$), tetramethylammonium hydroxide (TMAH), or a combination thereof. In one embodiment, the lateral etch is provided by a gas phase etch process containing hydrogen ($H_2$), hydrochroride (HCl), or a combination thereof. In one embodiment, the lateral etch is provided by a chemical downstream etch (CDE) comprising $CH_3F$, $CH_2F_2$, and/or $CF_4$ in conjunction with $O_2$.

Figure 11A:
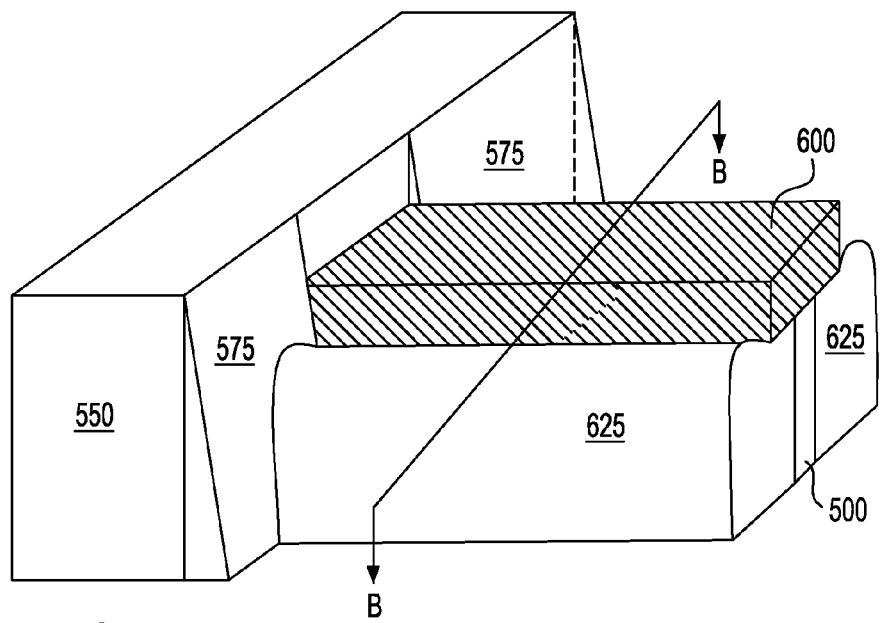
FIG. 11A is a perspective view of one embodiment of epitaxially growing an in-situ doped semiconductor material on the recess underlying the dielectric cap, wherein the in-situ doped semiconductor material provides an extension region of at least one of a source region and a drain region, in accordance with the present disclosure.
Figure 11B:
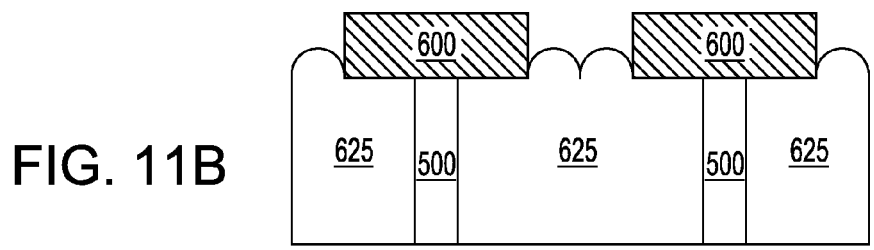
FIG. 11B is a side cross-sectional view of the structure depicted in FIG. 11A across section line B-B.

FIGS. 11A and 11B depict one embodiment of epitaxially growing an in-situ doped semiconductor material 625 on the recess underlying the dielectric cap 600, wherein the epitaxially grown in-situ doped semiconductor material 625 provides an extension region of at least one of a source region and a drain region to the finFET that includes the fin structure 500. The epitaxial growth and in-situ doping method for forming the in-situ doped semiconductor material 635 is similar to the epitaxial growth and in-situ doping method that provides the in-situ doped second source and drain regions 40a, 40b that are described above with reference to FIG. 5. Therefore, the details for forming the in-situ doped second source and drain regions 40a, 40b that are depicted in FIG. 5 are suitable for forming the epitaxially grown in-situ doped semiconductor material 625 that provides the extensions regions depicted in FIGS. 11A and 11B.

In some embodiments, the in-situ doped epitaxial semiconductor material 625 fills at least a portion of the undercut region, i.e., recess, that is underlying the dielectric cap 600. The in-situ doped epitaxial semiconductor material 625 may extend beyond the outer edge of the dielectric cap 600. The in-situ doped epitaxial semiconductor material 625 may be composed of the same base semiconductor material as the fin structure 500, or the in-situ doped epitaxial semiconductor material 625 may be composed of a different material than the base semiconductor material of the fin structure 500. In one example, the first material composition that provides the fin structure 500 is silicon, and the second material composition that provides the base semiconductor material of the in-situ doped epitaxial semiconductor material 625 is silicon germanium (SiGe) or silicon doped with carbon (Si:C). In the examples, in which the in-situ doped epitaxial semiconductor material 625 is silicon germanium (SiGe), the SiGe may induce a compressive stress on the channel portion of the fin structure 500. Typically, the finFET semiconductor device including in-situ doped epitaxial semiconductor material 625 composed of SiGe is a p-type finFET. In the examples, in which the in-situ doped epitaxial semiconductor material 625 is silicon doped with carbon (Si:C), the Si:C may induce a tensile stress on the channel portion of the fin structure 500. Typically, the finFET semiconductor device including in-situ doped epitaxial semiconductor material 625 composed of Si:C is an n-type finFET.

FIGS. 11A and 11B depict one embodiment of a finFET semiconductor device including a fin structure 500 having a first width and a dielectric cap 600 present on an upper surface of the fin structure 500 having a second width, wherein the second width is greater than the first width. A gate structure 550 present on a channel sidewall portion of the fin structure 500 and a portion of the dielectric cap 600 that is on an upper surface of the channel portion of the fin structure 500. FIGS. 11A and 11B further depict a doped epitaxial semiconductor material, i.e., in-situ doped epitaxial semiconductor material 625, in direct contact with a sidewall of the fin structure 500 that is adjacent to the channel sidewall portion of the fin structure 500. The doped epitaxial semiconductor material 625 fills at least a portion of the undercut region underlying the dielectric cap 600. The doped epitaxial semiconductor material provides an extension region of at least one of the source region and the drain region of the finFET. In some embodiments, because the extension region is epitaxially grown and in-situ doped material, the p-type or n-type dopant is uniformly present throughout the entire width of the extension region. Typically, the dopant concentration of the extension regions having the n-type conductivity ranges from $1 \times 10^{19}$ atoms/cm$^3$ to $2 \times 10^{21}$ atoms/cm$^3$. In another embodiment, the extension regions have the p-type conductivity dopant with a concentration ranging from $2 \times 10^{19}$ atoms/cm$^3$ to $5 \times 10^{20}$ atoms/cm$^3$. In one embodiment, the uniform dopant concentration is characterized by a variation in the dopant concentration of less than $1 \times 10^{19}$ atoms/cm$^3$ per nanometer. In another embodiment, the uniform dopant concentration is characterized by a variation in the dopant concentration of less than $1 \times 10^{18}$ atoms/cm$^3$ per nanometer. In yet another embodiment, the uniform dopant concentration is characterized by a variation in the dopant concentration of less than $1 \times 10^{17}$ atoms/cm$^3$ per nanometer.

FIG. 11B depicts one embodiment of the present disclosure, in which finFET semiconductor device is electrically connected through the doped epitaxial material, i.e., in-situ doped epitaxial semiconductor material 625, to an adjacent doped epitaxial material of an adjacent finFET semiconductor device. By connecting the two or more finFET devices through the doped epitaxial material, i.e., in-situ doped epitaxial semiconductor material 625, the electrical width of the device may be increased.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of fabricating a semiconductor device comprising:
    providing a first fin structure for a first conductivity semiconductor device and a second fin structure for a second conductivity semiconductor device on a substrate;
    forming a gate structure in direct contact with at least a channel portion of the first fin structure and the second fin structure;
    forming a blanket dielectric over the first fin structure and the second fin structure;
    removing a portion of the blanket dielectric to expose at least sidewalls of the second fin structure, wherein a remaining portion of the blanket dielectric covers at least sidewalls of the first fin structure;
    epitaxially forming in-situ doped second source and drain regions having a facetted exterior sidewall on the sidewalls of the second fin structure, wherein the remaining portion of the blanket dielectric obstructs epitaxial growth on the sidewalls of the first fin structure;
    removing the remaining portion of the blanket dielectric to expose at least the sidewalls of the first fin structure; and
    forming first source and drain regions on the sidewalls of the first fin structure.

2. The method of claim 1, wherein the first source and drain regions are doped to a first conductivity, and the in-situ doped second source and drain regions are doped to a second conductivity, wherein the first conductivity is n-type and the second conductivity is p-type.

3. The method of claim 1, wherein the removing of the portion of the blanket dielectric to expose at least the sidewalls of the second fin structure comprises:
    forming a first photoresist mask over a first portion of the blanket dielectric that is contact with the first fin structure and a portion of the gate structure that is in contact with the first fin structure;
    removing the portion of the blanket dielectric to expose the at least the sidewalls of the second fin structure with an anisotropic etch that is selective to the first photoresist mask, wherein a first section of the remaining portion of the blanket dielectric is protected by the first photoresist mask and a second section of the remaining portion of the blanket dielectric provides a second spacer present on the gate structure that is abutting the second fin structure; and removing the first photoresist mask.

4. The method of claim 3, wherein the removing the remaining portion of the blanket dielectric to expose at least the sidewalls of the first fin structure comprise forming a second photoresist mask over the second fin structure, and anisotropically etching the first section of the remaining portion of the blanket dielectric, wherein a remaining section of the first section of the remaining portion of the blanket dielectric provides a first spacer adjacent to the first fin structure.

5. The method of claim 1, further comprising diffusing dopant from the in-situ doped second source and drain regions into the second fin structure by annealing.

6. The method of claim 1, further comprising forming a second doped contact region in direct contact with the in-situ doped second source and drain regions, wherein the second doped contact region has the same conductivity as the in-situ doped second source and drain regions.

7. The method of claim 6, wherein the forming first source and drain regions on the sidewalls of the first fin structure comprises:

forming a third photoresist mask over the second fin structure;

forming extension regions in the sidewalls of the first fin structure using an angled ion implant; and epitaxially growing a first doped contact region having the same conductivity as the extension regions, and in direct contact with the extension regions in the first fin structure, wherein the first doped contact region is isolated from the second doped contact region.

\* \* \* \* \*